United States Patent
Ma et al.

[11] Patent Number: 6,020,611
[45] Date of Patent: Feb. 1, 2000

[54] SEMICONDUCTOR COMPONENT AND METHOD OF MANUFACTURE

[75] Inventors: Gordon C. Ma, Phoenix; Christopher P. Dragon, Tempe, both of Ariz.

[73] Assignee: Motorola, Inc., Schaumburg, Ill.

[21] Appl. No.: 09/095,504

[22] Filed: Jun. 10, 1998

[51] Int. Cl.$^7$ ................................................. H01L 29/78
[52] U.S. Cl. .......................... 257/336; 257/344; 257/408
[58] Field of Search ................................. 257/336, 344, 257/408

[56] References Cited

U.S. PATENT DOCUMENTS

| | | | |
|---|---|---|---|
| H986 | 11/1991 | Codella et al. | 257/344 |
| 3,988,761 | 10/1976 | Kanazawa | 257/336 |
| 4,818,715 | 4/1989 | Chao. | |
| 5,217,913 | 6/1993 | Watabe et al. . | |
| 5,371,394 | 12/1994 | Ma et al. | 257/336 |
| 5,386,136 | 1/1995 | Williams et al. | 257/344 |
| 5,451,807 | 9/1995 | Fujita | 257/344 |
| 5,552,329 | 9/1996 | Kim et al. . | |
| 5,719,425 | 2/1998 | Akram et al. . | |

OTHER PUBLICATIONS

S. Ogura et al, "A Half Micron Mosfet Using Double Implanted LDD" IEDM 82, Section 29.6, May 1982, pp. 718–721.

*Primary Examiner*—Gene M. Munson
*Attorney, Agent, or Firm*—Rennie William Dover

[57] ABSTRACT

A semiconductor component includes a substrate (101), an electrode (105) located over the substrate (101), a heavily doped region (542) located in the substrate (101) and self-aligned to the electrode (105), an other heavily doped region (543) located in the substrate (101), a lightly doped region (422) located in the substrate (101) between the heavily doped regions (542, 543) and self-aligned to the electrode (105), and another lightly doped region (432) located in the substrate (101) between the lightly doped region (422) and the other heavily doped region (543).

14 Claims, 2 Drawing Sheets

SEMICONDUCTOR COMPONENT AND METHOD OF MANUFACTURE

BACKGROUND OF THE INVENTION

This invention relates, in general, to electronics, and more particularly, to semiconductor components and methods of manufacture.

Many high voltage semiconductor devices suffer from a hot carrier injection phenomenon where high electric fields within the intrinsic device inject electrons into a gate oxide. The presence of electrons in the gate oxide causes many problems including a shift in the threshold voltage and a reduction in the gain and output power of the device. Prior art techniques for reducing the hot carrier injection phenomenon degrade both the on resistance and the breakdown voltage of the device by increasing the on resistance and decreasing the breakdown voltage.

Accordingly, a need exists for a semiconductor component and method of manufacture that reduces or eliminates the hot carrier injection phenomenon while maintaining the on resistance and breakdown voltage of the component.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
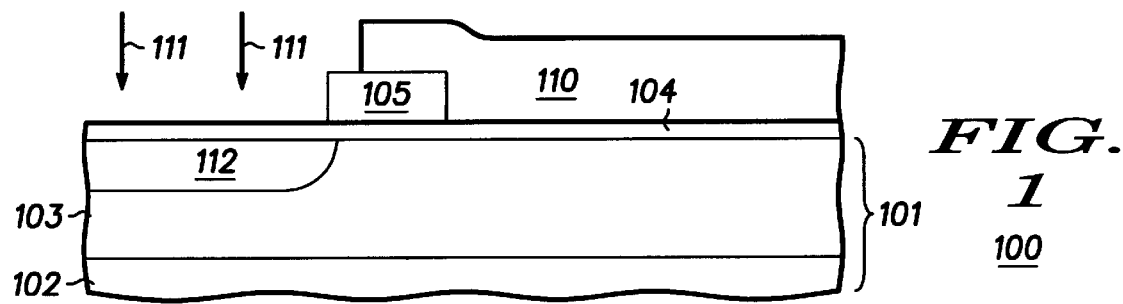
FIGS. 1–6 illustrate cross-sectional views of an embodiment of a semiconductor component during manufacturing in accordance with the present invention.

FIGS. 1–6 illustrate cross-sectional views of an embodiment of a semiconductor component 100 during manufacturing. FIG. 1 illustrates component 100 having a composite substrate 101 comprising a support substrate 102 and a device layer 103. Substrate 102 supports layer 103. Layer 103 is located over substrate 102, is used to form the active region of component 100, and has a first conductivity type and a doping concentration. In the preferred embodiment, substrate 102 and layer 103 are both comprised of semiconductors. As an example, substrate 102 can be a monocrystalline silicon substrate, and layer 103 can be a silicon epitaxial layer grown over substrate 102. Preferably, layer 103 has a uniform p-type doping concentration of approximately $1\times10^{14}$ to $1\times10^{16}$ atoms per centimeter cubed.

A dielectric layer 104 is formed over an exposed major surface of layer 103 of substrate 101. Preferably, layer 104 is a silicon dioxide layer used as a gate oxide within component 100. Layer 104 can be approximately ten to one hundred nanometers thick, but is preferably thermally grown to a thickness of approximately seventy nanometers.

An electrode 105 is formed over layers 103 and 104. Preferably, electrode 105 serves as the gate electrode for component 100. As an example, electrode 105 can be formed by patterning a layer of doped polysilicon alone or by patterning a layer of silicide and an underlying layer of doped polysilicon.

Next, a masking layer 110 is formed over a portion of electrode 105 and over other portions of layers 103 and 104. Preferably, a portion or a side of electrode 105 remains exposed and is not covered by layer 110. In the preferred embodiment, layer 110 is comprised of photoresist and is used as an ion implantation mask to block subsequently implanted ions from penetration into the portions of layer 103 located underneath layer 110.

While layer 110 remains over substrate 101, a dopant 111 is used to form a doped region 112 into layer 103. After the formation of region 112, masking layer 110 is removed. Region 112 has the first conductivity type of layer 103. In the preferred embodiment, dopant 111 is comprised of boron ions that are implanted through layer 104 and into layer 103. In this embodiment, layer 104 serves as an implant screen to reduce the channeling of the implanted ions. The implantation of dopant 111 is preferably self-aligned, which also makes region 112 self-aligned, to the exposed side of electrode 105 to improve the repeatability and accuracy of the location of region 112 from component to component. A portion of region 112 remains at the major surface of layer 103.

Figure 2:
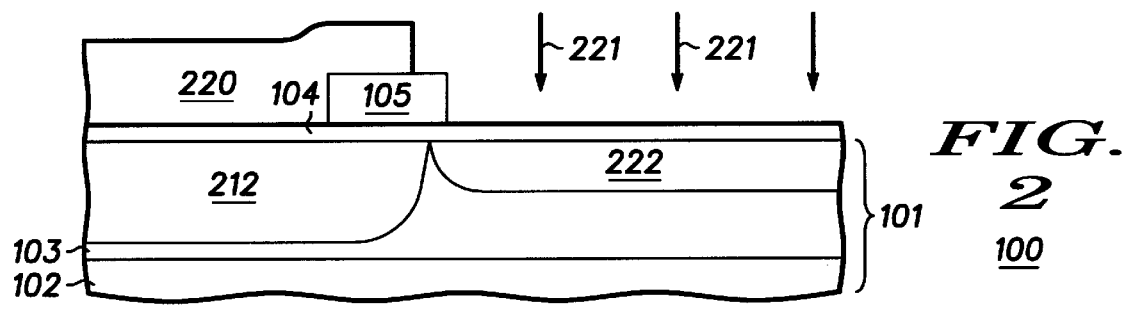

Region 112 of FIG. 1 is subsequently diffused during a high temperature annealing step and is converted into a doped region 212, as illustrated in FIG. 2. Region 212 in FIG. 2 is deeper and wider than region 112 in FIG. 1 and has a greater doping concentration than layer 103. Region 212 in FIG. 2 preferably underlies a major portion of electrode 105, for reasons explained hereinafter.

After the diffusion step, a masking layer 220 is formed over electrode 105 and region 212, as illustrated in FIG. 2. Preferably, a side of electrode 105 that is opposite region 212 remains exposed and is not covered by layer 220. In the preferred embodiment, layer 220 is similar to layer 110 in FIG. 1.

Then, a dopant 221 is used to form a doped region 222 in layer 103. Region 222 is formed adjacent to region 212. Layer 220 blocks or prevents dopant 221 from penetrating into portions of layer 103 located underneath layer 220. After the formation of region 222, masking layer 220 is removed.

Region 222 has a second conductivity type different from that of layer 103 and region 212. In the preferred embodiment, dopant 221 is comprised of arsenic ions that are implanted through layer 104 and into layer 103. In this embodiment, layer 104 serves as an implant screen to reduce the channeling of the implanted ions. A portion of region 222 remains at the surface of layer 103, and a peak doping concentration of region 222 is preferably located at the surface of layer 103. As an example, the arsenic ions of dopant 221 can be implanted at an energy of approximately one hundred to two hundred kilo-electronVolts. Dopant 221 is preferably not implanted into region 212. However, the implantation of dopant 221 is preferably self-aligned, which makes region 222 self-aligned, to the exposed side of electrode 105 to improve the repeatability and accuracy of the location of region 222 from component to component. Furthermore, dopant 221 preferably has an implant dosage less than that of dopant 111 in FIG. 1. As an example, dopant 221 can be implanted at an implant ion dose of approximately $1\times10^{12}$ to $1\times10^{13}$ ions per centimeter squared.

Figure 3:
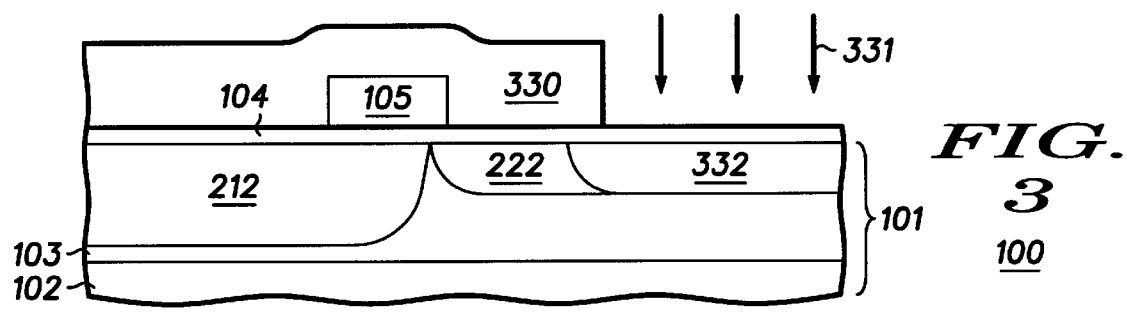

After the formation of region 222 and the removal of layer 220, a masking layer 330 is formed over electrode 105, over region 212, and over a portion of region 222 that is closest to electrode 105, as illustrated in FIG. 3. In this embodiment, layer 330 completely covers all of electrode 105. Layer 330 can be similar to layer 110 in FIG. 1.

Then, a dopant 331 is used to form a doped region 332 in or at least adjacent to region 222 of layer 103. Layer 330 blocks or prevents dopant 331 from penetrating into portions of layer 103 located underneath layer 330. After the formation of region 332, masking layer 330 is removed.

Region 332 has the second conductivity type of region 222. In the preferred embodiment, dopant 331 is comprised of arsenic ions that are implanted through layer 104 and into a portion of region 222 that is not covered by layer 330. In this embodiment, layer 104 serves as an implant screen to reduce the channeling of the implanted ions. A portion of region 332 remains at the surface of layer 103, and similar to region 222, a peak doping concentration of region 332 is preferably located at the surface of layer 103. As an example, the arsenic ions of dopant 221 can be implanted at a similar implant energy as dopant 221 in FIG. 2. Dopant 331 is preferably not implanted into region 212 and is preferably not self-aligned to electrode 105 or any other permanent features in component 100 in order to provide improved electrical performance of component 100, as explained hereinafter. Furthermore, dopant 331 preferably has an implant dosage less than that of dopant 111 in FIG. 1, but can be greater than, less than, or equal to that of dopant 221 in FIG. 2. As an example, dopant 221 can be implanted at an implant ion dose of approximately $1 \times 10^{12}$ to $1 \times 10^{13}$ ions per centimeter squared.

Figure 4:
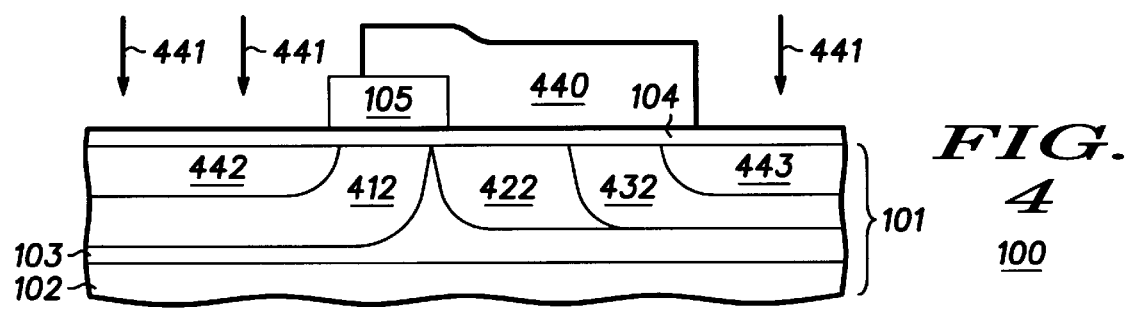

After the removal of layer 330, regions 222 and 332 of FIG. 3 are subsequently diffused during a high temperature annealing step and are converted into doped regions 422 and 432, respectively, as illustrated in FIG. 4. Also during this anneal, region 212 of FIG. 3 is simultaneously diffused and, thus, converted into a doped region 412, as illustrated in FIG. 4. Regions 412, 422, and 432 in FIG. 4 are deeper and wider than regions 212, 222, and 332, respectively, in FIG. 3. Furthermore, region 412 is preferable deeper than regions 422 and 432.

After the annealing step, the peak doping concentrations of regions 422 and 432 preferably remain at the surface of layer 103. Additionally, region 432 preferably has a greater or higher doping concentration than region 422 and a lesser or lower doping concentration than region 412. Furthermore, region (422 preferably has a doping concentration that is approximately ten to one hundred times higher than that of layer 103. Moreover, a portion of region 422 underlies electrode 105 after the annealing step.

Next, as illustrated in FIG. 4, a masking layer 440 is formed over electrode 105 and portions of regions 422 and 432 that are closest to electrode 105. In the preferred embodiment, a side of electrode 105 that is opposite regions 422 and 432 remains exposed and is not covered by layer 440. Layer 440 is preferably similar to layer 110 in FIG. 1.

Then, a dopant 441 is used to simultaneously form doped regions 442 and 443 into layer 103 while layer 440 remains over substrate 101. Portions of regions 412, 422, and 432 are located between regions 442 and 443. Layer 440 blocks or prevents dopant 441 from penetrating into portions of layer 103 located underneath layer 440. After the formation of regions 442 and 443, masking layer 440 is removed.

Regions 442 and 443 have the second conductivity type of regions 422 and 432 and are located at opposite sides of electrode 105. Portions of regions 442 and 443 remain at the surface of layer 103. In the preferred embodiment, dopant 441 is comprised of arsenic ions that are implanted through layer 104 and into a portion of region 412 to form region 442, and are also implanted through layer 104 and into a portion of regions 422 and 432 that are not covered by layer 440 to form region 443. In this embodiment, layer 104 serves as an implant screen to reduce the channeling of the implanted ions. Additionally, the implantation of dopant 441 for the formation of region 442 is preferably self-aligned to the exposed side of electrode 105 to improve the repeatability and accuracy of the location of region 442 from component to component. However, the implantation of dopant 441 for the formation of region 443 is preferably not self-aligned to electrode 105 or any other permanent features in component 100 in order to provide improved electrical performance of component 100, as explained hereinafter. Dopant 441 has an ion implant dosage greater than that of dopant 111 in FIG. 1.

Figure 5:
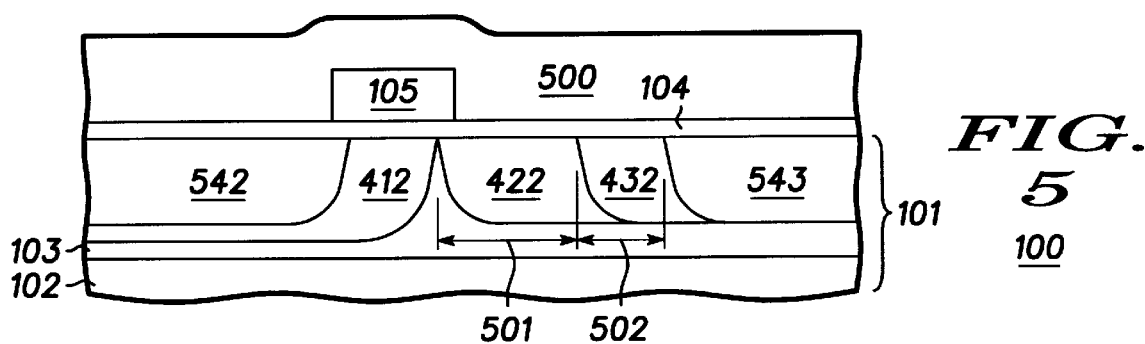

After the removal of layer 440, regions 442 and 443 of FIG. 4 are simultaneously diffused during a high temperature annealing step and are converted into doped regions 542 and 543, respectively, as illustrated in FIG. 5. During this annealing step, regions 412, 422, and 432 of FIG. 4 are preferably not significantly diffused. To accomplish this selective diffusion, the time and temperature of this annealing step should be shorter and lower, respectively, than that of the previously described annealing steps. After this annealing step, regions 542 and 543 in FIG. 5 are deeper and wider than regions 442 and 443, respectively, in FIG. 4. A portion of region 542 underlies electrode 105 after the annealing step.

In the preferred embodiment, regions 542 and 543 both have the same depths as regions 422 and 432, which is approximately one hundred to three hundred nanometers. However, region 412 is preferable deeper than regions 542 and 543. In the preferred embodiment, regions 412, 422, 432, 542, or 543 are absent from support substrate 102. Regions 542 and 543 have greater or higher doping concentrations than layer 103 and regions 412, 422, and 432. Furthermore, a distance 501 along the surface of layer 103 between an outer edge of region 422 and an outer edge of region 432 is different from a distance 502 along the surface of layer 103 between the outer edge of region 432 and an outer edge of region 543. In the preferred embodiment illustrated in FIG. 5, distance 501 is greater than distance 502. When a length of electrode 105 is less than approximately one micrometer, a sum of distances 501 and 502 is greater than approximately one micrometer and is tailored to meet the device breakdown voltage and on resistance specifications. In the preferred embodiment, distances 501 and 502 have a ratio of approximately two to one.

Also in FIG. 5, an electrically insulative layer 500 is disposed over the entire surface of layer 103, electrode 105, and layer 104. Layer 500 can be comprised of silicon nitride, silicon oxide, or both. Layer 500 can also be a composite layer comprised of a plurality of dielectric layers.

Figure 6:
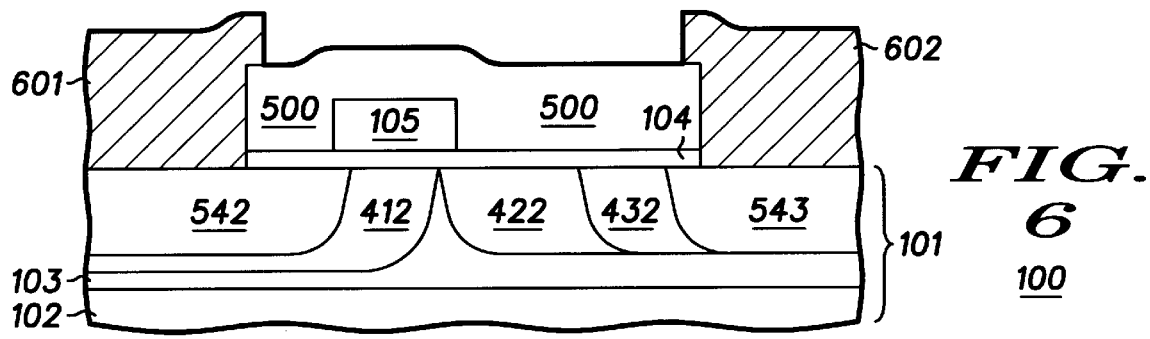

Continuing with FIG. 6, layer 500 is patterned. Preferably, layer 500 is anisotropically etched using an etch mask (not illustrated in FIG. 6) to define the pattern illustrated in FIG. 6. Layer 500 is preferably not isotropically etched in order to provide more repeatably controlled openings within layer 500 from component to component. The same etch mask can also be used to pattern layer 104, as illustrated in FIG. 6.

Subsequently, electrical contacts 601 and 602 are formed over regions 542 and region 543, respectively. As an example, contacts 601 and 602 can be formed using a platinum salicide process.

In the preferred embodiment, component 100 is a laterally diffused metal oxide semiconductor (LDMOS) device wherein contacts 601 and 602 are the source and drain electrodes, respectively. In this embodiment, regions 542 and 543 are the source and drain regions, respectively; a portion of region 412 located underneath electrode 105 forms the channel region; and regions 422 and 432 are lightly doped drain regions. Region 412 separates regions 542 and 543 and prevents region 543 from modulating region 542, and the doping level of region 412 controls the threshold voltage of component 100. The combination of regions 422 and 432 optimizes the effects of the hot carrier injection phenomenon, the on resistance, and the breakdown voltage. In particular, the lighter doping level of region 422 eliminates or at least reduces the hot carrier injection phenomenon of the prior art devices, and the higher doping level of region 432 maintains or at least provides adequate on resistance and breakdown voltage for component 100. In one embodiment, the on resistance is less than approximately twenty-one ohms-millimeters of gate width, and the drain-to-source breakdown voltage (BVdss) is greater than approximately seventy volts. Prior art devices using only a single lightly doped drain region cannot simultaneously optimize a reduction in the hot carrier injection phenomenon while maintaining a low on resistance and a high breakdown voltage.

As illustrated in FIG. 6, component 100 is preferably devoid of isotropically etched, permanent dielectric spacers having the shape of a quarter of a circle located adjacent to electrode 105. Prior art devices self-align lightly doped source and drain regions in a semiconductor substrate to the permanent spacers. However, in component 100, regions 422 and 432 cannot be self-aligned to the prior art permanent spacers because distances 501 and 502 are much larger than the widths of the prior art permanent spacers. Therefore, temporary or removable masks are used to formed the doped regions of component 100.

Component 100 is preferably an asymmetrical device in that component 100 does not have lightly doped source regions. The applications for component 100 are such that the lightly doped source regions are not needed to provide suitable high voltage performance. By having an asymmetrical profile, component 100 is smaller than any similar symmetrical device with comparable breakdown voltage, and the smaller size lowers the cost of component 100.

Figure 7:
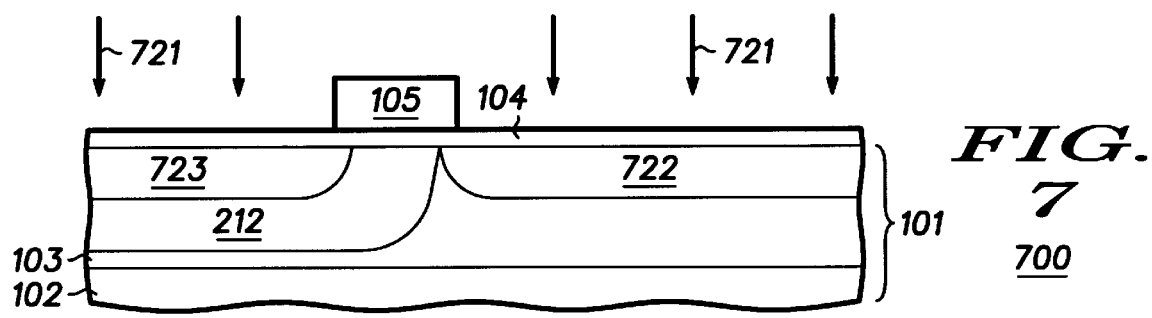
FIG. 7 illustrates a cross-sectional view of a different embodiment of the semiconductor component of FIG. 2 in accordance with the present invention.

FIG. 7 illustrates a cross-sectional view of a semiconductor component 700 during manufacturing. FIG. 7 is similar to FIG. 2. In FIG. 7, a dopant 721 can be implanted into layer 103 to form doped regions 722 and 723 that are self-aligned to opposite sides of electrode 105. Dopant 721 and region 722 are similar to dopant 221 and region 222, respectively, of FIG. 2. However, unlike component 100 in FIG. 2, a removable implant mask is not used to form component 700 in FIG. 7 at this stage of the manufacturing process. The absence of an implant mask permits the formation of region 723 within region 212. The implant mask can be eliminated because region 542 (FIGS. 5 and 6) is subsequently formed over or in region 723, and the doping level of region 542 is much higher than that of region 723. Therefore, region 723 is subsequently eliminated by region 542.

Figure 8:
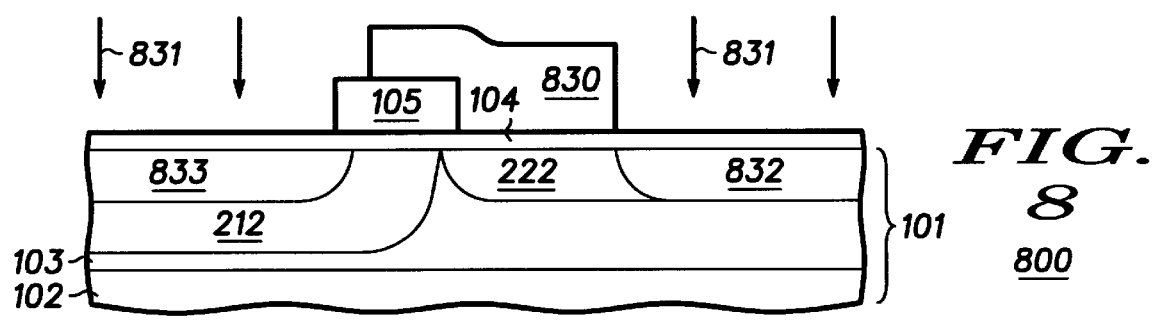
FIG. 8 illustrates a cross-sectional view of a different embodiment of the semiconductor component of FIG. 3 in accordance with the present invention.

FIG. 8 illustrates a cross-sectional view of a semiconductor component 800 during manufacturing. FIG. 8 is similar to FIG. 3. In FIG. 8, a dopant 831 can be implanted into layer 103 to form doped regions 832 and 833 where region 833 is self-aligned to electrode 105. Dopant 831 and region 832 are similar to dopant 331 and region 332, respectively, in FIG. 3. However, unlike component 100 in FIG. 3, a masking layer 830 in FIG. 8 does not cover region 212 beyond electrode 105. This configuration of layer 830 permits the formation of region 833 within region 212. Layer 830 can be eliminated from over region 212 because region 542 (FIGS. 5 and 6) is subsequently formed in or over region 833, and the doping level of region 542 is much higher than that of region 833. Therefore, region 833 is subsequently eliminated by region 542.

Therefore, an improved semiconductor component and method of manufacture is provided to overcome the disadvantages of the prior art. The method of manufacture produces an asymmetrical semiconductor component that reduces or eliminates the hot carrier injection phenomenon while maintaining the on resistance and the breakdown voltage of the component. These features are accomplished by the two lightly doped drain regions having different doping concentrations to reduce the electric field between the source and drain at the gate-to-drain edge and to optimize the on resistance and breakdown voltage.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the specific ions, implant doses, implant energies, and distances are provided to facilitate the understanding of the present invention and are not provided to limit the scope of the invention. As another example, layer 104 of FIGS. 1–4, 7, and 8 can be replaced by a different implant screen. Alternatively, dopants 111, 221, 331, 441, 721, and 831 can be implanted into layer 103 without the use of an implant screen. Furthermore, the variations described in FIGS. 7 and 8 can be combined together to form yet another variation to the process described in FIGS. 1–6. In general, the concepts disclosed herein are applicable for semiconductor devices having high breakdown voltages greater than approximately ten volts.

Accordingly, the disclosure of the present invention is not intended to be limiting. Instead, the disclosure of the present invention is intended to be illustrative of the scope of the invention, which is set forth in the following claims.

We claim:

1. A semiconductor component comprising:

a substrate;

an electrode located over the substrate and having a first side and a second side opposite the first side;

a first doped region located in the substrate, self-aligned to the first side of the electrode, and having a first doping concentration;

a second doped region located in the substrate at the second side of the electrode and having the first doping concentration;

a third doped region located in the substrate at the second side of the electrode between the first and second doped regions and having a second doping concentration less than the first doping concentration; and a fourth doped region located in the substrate at the second side of the electrode between the second and third doped regions and having a third doping concentration different from the second doping concentration and less than the first doping concentration;

wherein a first distance between an edge of the third doped region and an edge of the fourth doped region is different from a second distance between the edge of the fourth doped region and an edge of the second doped region.

2. The semiconductor component of claim 1 wherein the second doping concentration is less than the third doping concentration.

3. The semiconductor component of claim 1 wherein peak doping concentrations of the third and fourth doped regions are located at a surface of the substrate.

4. The semiconductor component of claim 1 wherein the first and third doped regions are self-aligned to opposite sides of the electrode.

5. The semiconductor component of claim 1 wherein a sum of the first and second distances is greater than approximately one micrometer.

6. A semiconductor component comprising:
a semiconductor substrate with a first conductivity type and having a first surface;
a gate electrode located over the first surface;
a first region with the first conductivity type located in the semiconductor substrate, at the first surface, and self-aligned to the gate electrode, wherein a portion of the first region underlies the gate electrode;
a source region with a second conductivity type located within the first region, at the first surface, and self-aligned to the gate electrode, wherein an edge portion of the source region underlies the gate electrode and wherein the second conductivity type is different from the first conductivity type;
a first lightly doped drain region with the second conductivity type located in the semiconductor substrate, adjacent to the first region, at the first surface and self-aligned to the gate electrode, wherein the first lightly doped drain region is separated from the source region by the portion of the first region and wherein an edge portion of the first lightly doped drain region underlies the gate electrode;
a second lightly doped drain region with the second conductivity type located within the first lightly doped drain region and at the first surface; and
a drain region with the second conductivity type located within the first and second lightly doped drain regions and at the first surface,
wherein a first distance along the first surface from an outer edge of the first lightly doped drain region to an outer edge of the second lightly doped drain region is greater than a second distance along the first surface from the outer edge of the second lightly doped drain region to an outer edge of the drain region,
wherein a doping concentration of the first lightly doped drain region is less than doping concentrations of the first, source, second lightly doped drain, and drain regions and is greater than a doping concentration of the semiconductor substrate, and
wherein the doping concentration of the second lightly doped drain region is less than the doping concentrations of the first, source, and drain regions.

7. The semiconductor component of claim 6 where the semiconductor substrate further comprises:
a support substrate; and
an epitaxial semiconductor layer with the first conductivity type and located over the support substrate wherein the first, source, first lightly doped drain, second lightly doped drain, and drain regions are located in the epitaxial semiconductor layer and are absent from the support substrate and wherein the first region has a doping concentration greater than the epitaxial semiconductor layer.

8. The semiconductor component of claim 6 wherein peak doping concentrations of the first and second lightly doped drain regions are located at the first surface,
wherein depths of the source, first lightly doped drain, second lightly doped drain, and drain regions are approximately equal to each other, and
wherein a depth of the first region is greater than the depths of the source, first lightly doped drain, second lightly doped drain, and drain regions.

9. The semiconductor component of claim 6 wherein the semiconductor component is asymmetrical and is devoid of a lightly doped source region.

10. The semiconductor component of claim 9 wherein a sum of the first and second distances is greater than approximately one micrometer.

11. The semiconductor component of claim 9 wherein the gate electrode has a length across the first surface of less than approximately one micrometer and wherein a ratio between the first and second distances is approximately two to one.

12. The semiconductor component of claim 6 wherein the semiconductor component is devoid of a dielectric spacer having a shape of a quarter of a circle located adjacent to the gate electrode.

13. A semiconductor component comprising:
a semiconductor substrate with a surface;
a gate electrode overlying the surface of the semiconductor substrate;
a source region located in the semiconductor substrate and self-aligned to the gate electrode;
a drain region located in the semiconductor substrate;
a first lightly doped drain region located in the semiconductor substrate between the source and drain regions and self-aligned to the gate electrode; and
a second lightly doped drain region located in the semiconductor substrate between the drain and first lightly doped drain regions,
wherein a first distance along the surface from an edge of the first lightly doped drain region to an edge of the second lightly doped drain region is greater than a second distance along the surface from the edge of the second lightly doped drain region to an edge of the drain region,
wherein a doping concentration of the first lightly doped drain region is less than doping concentrations of the source, second lightly doped drain, and drain regions, and
wherein the doping concentration of the second lightly doped drain region is less than the doping concentrations of the source and drain regions.

14. The semiconductor component of claim 13 wherein the first distance is at least twice as long as the second distance.

* * * * *